US009262559B2

(12) United States Patent
Mewes et al.

(10) Patent No.: US 9,262,559 B2
(45) Date of Patent: Feb. 16, 2016

(54) MANAGEMENT TOOLS FOR QUANTIFICATION AND SIMULATION OF PERFORMANCE AND OUTCOME OF WINTER TRANSPORTATION INFRASTRUCTURE MAINTENANCE ACTIVITIES

(71) Applicant: ITERIS, INC., Santa Ana, CA (US)

(72) Inventors: John J. Mewes, Mayville, ND (US); Jeffrey J. Kuntz, Grand Forks, ND (US); Kristopher A. Zarns, Fisher, MN (US); Gregory M. Ostermeier, Grand Forks, ND (US)

(73) Assignee: ITERIS, INC., Santa Ana, CA (US)

( * ) Notice: Subject to any disclaimer, the term of this patent is extended or adjusted under 35 U.S.C. 154(b) by 315 days.

(21) Appl. No.: 13/753,114

(22) Filed: Jan. 29, 2013

(65) Prior Publication Data

US 2013/0197889 A1    Aug. 1, 2013

Related U.S. Application Data

(60) Provisional application No. 61/592,467, filed on Jan. 30, 2012.

(51) Int. Cl.
 *G06F 17/50* (2006.01)
 *G06Q 10/06* (2012.01)
 *G06Q 10/00* (2012.01)
(52) U.S. Cl.
 CPC ........ *G06F 17/5009* (2013.01); *G06Q 10/0639* (2013.01); *G06Q 10/20* (2013.01)
(58) Field of Classification Search
 None
 See application file for complete search history.

(56) References Cited

U.S. PATENT DOCUMENTS

| | | | |
|---|---|---|---|
| 5,798,949 | A | 8/1998 | Kaub |
| 5,982,325 | A | 11/1999 | Thornton et al. |
| 6,166,657 | A | 12/2000 | Mann |
| 6,535,141 | B1 | 3/2003 | Doherty |
| 7,421,334 | B2 | 9/2008 | Dahlgren et al. |
| 7,945,385 | B2 | 5/2011 | Villalobos et al. |
| 8,145,513 | B2 | 3/2012 | Villalobos et al. |
| 8,275,522 | B1 | 9/2012 | Groeneweg et al. |
| 2002/0067289 | A1 | 6/2002 | Smith |
| 2005/0010365 | A1 | 1/2005 | Chapman et al. |
| 2005/0065711 | A1 | 3/2005 | Dahlgren et al. |
| 2007/0208498 | A1 | 9/2007 | Barker et al. |
| 2007/0299887 | A1 | 12/2007 | Novik et al. |

(Continued)

FOREIGN PATENT DOCUMENTS

RU    108681 U1    9/2011

OTHER PUBLICATIONS

Perrier et al., "Asury ey of models and algorithms for winter road maintenance." Parts I-IV, Computers & Operations Research, Jan. 2007.*

(Continued)

*Primary Examiner* — Charlie Y Peng
(74) *Attorney, Agent, or Firm* — Lazaris IP

(57) ABSTRACT

An apparatus and system for evaluating winter transportation infrastructure maintenance operations includes a quantification component and a simulation component. Input data representative of collected winter transportation infrastructure maintenance data and observed transportation infrastructure data are modeled in a comprehensive data processing mechanism to measure and carry out effective and efficient winter maintenance planning and operations.

22 Claims, 9 Drawing Sheets

(56) References Cited

U.S. PATENT DOCUMENTS

| | | |
|---|---|---|
| 2011/0035187 A1 | 2/2011 | Dejori et al. |
| 2011/0106727 A1 | 5/2011 | Noyes |
| 2011/0298638 A1* | 12/2011 | Groeneweg .................. 340/905 |
| 2012/0105255 A1 | 5/2012 | Rennie et al. |
| 2013/0024336 A1 | 1/2013 | Jones et al. |

OTHER PUBLICATIONS

Jelokhani-Niaraki, et al., "Designing Road Maintenance Data Model Using Dynamic Segmentation Technique", Computational Science and Its Applications—ICCSA Jun. 2009.*

Handa, Hisashi; "Robust Route Optiimzation for Gritting/Salting Trucks: A Cercia Experience"; Okayama University, Japan; IEEE Computational Intelligence Magazine, 2006, p. 5-9.

* cited by examiner

| File | Report | Options | Region | Update | Help |

TP1CR210: TH194, N> Jct. US53 to Duluth HQ @ Mesaba Ave. (MN-219) from Dec 1, 2011 to Dec 27, 2011

| Pass # | Time | Plow Position | Application | Daily NaCl Usage (lbs/ln-ml) | Cumulative NaCl Usage (lbs/ln-ml) |
|---|---|---|---|---|---|
| 1 | 12:01AM Thu Dec 1, 2011 | na | Be aware of Frost Risk (precautionary) | 0 | 0 |
| 2 | 12:03AM Thu Dec 1, 2011 | na | Be aware of Frost Risk (precautionary) | 0 | 0 |
| 3 | 3:58AM Sat Dec 3, 2011 | na | Be aware of Frost Risk (precautionary) | 0 | 0 |
| 4 | 5:46AM Sat Dec 3, 2011 | na | Be aware of Frost Risk (precautionary) | 0 | 0 |
| 5 | 6:35AM Tue Dec 5, 2011 | na | Be aware of Frost Risk (precautionary) | 0 | 0 |
| 6 | 4:38AM Thu Dec 8, 2011 | none | Prewet Salt @ 300 lbs | 300 | 300 |
| 7 | 12:00AM Sun Dec 11, 2011 | na | Be aware of Frost Risk (precautionary) | 0 | 0 |

Route Selection — 526

Mode Selection — 304

Exit WMRI Mode | Switch to Spatial View | Switch Report Type

FIG. 6

MANAGEMENT TOOLS FOR QUANTIFICATION AND SIMULATION OF PERFORMANCE AND OUTCOME OF WINTER TRANSPORTATION INFRASTRUCTURE MAINTENANCE ACTIVITIES

CROSS-REFERENCE TO RELATED PATENT APPLICATIONS

This patent application claims priority to U.S. provisional application 61/592,467, filed on Jan. 30, 2012, the contents of which are incorporated in their entirety herein.

STATEMENT REGARDING FEDERALLY-SPONSORED RESEARCH OR DEVELOPMENT

Not applicable.

FIELD OF THE INVENTION

The present invention relates generally to winter transportation infrastructure maintenance. More specifically, particular embodiments of the present invention relate to quantifying and simulating the performance and outcome of winter transportation infrastructure maintenance activities to improve activity evaluation for efficiency and effectiveness.

BACKGROUND OF THE INVENTION

Historically, agencies and entities that undertake or are responsible for winter transportation infrastructure maintenance activities have measured resource utilization in the performance of such winter maintenance activities in several ways. At the lowest level, deicer, abrasive, equipment, and labor usage are estimated and logged by individuals performing winter maintenance, or by their direct supervisors. At the highest level, an agency or entity may also wish to track resource utilization through its procurement and/or payroll processes (e.g. the agency may have direct information as to the quantity of a particular resource it has purchased over a given time frame). In many cases, both approaches are utilized, with ad-hoc methods used to address the potentially substantial differences which inevitably result when trying to integrate data from bottom-up and top-down measurement methods.

In addition to tracking resource utilization, many agencies also define goals for the results of winter maintenance activities, and then attempt to measure the over- or under-achievement of these goals. This may be considered as an attempt to measure the 'effectiveness' of winter maintenance operations, and is a far more difficult step due to the inherent subjectivity involved in assessing road conditions, much less the difficulty of tracking changes to the road conditions over time in response to maintenance activities performed in the face of changing weather conditions.

Taken together, knowledge of winter maintenance resource utilization and winter maintenance effectiveness permit the determination of winter maintenance efficiency. There are inherent tradeoffs between resource utilization and the road conditions resulting from it, and efficiency measurement permits evaluation of these tradeoffs.

Complicating an efficiency measurement for winter maintenance activities is the variability of weather conditions. When comparing data from one area to another, or one storm or weather pattern to another, the variability of weather conditions makes it very difficult for winter maintenance managers to know whether the maintenance response was appropriate for the weather conditions being treated. This hinders management's ability to identify which practices and approaches are more effective or efficient, since it is difficult to ascertain whether any particular comparison over time, or between maintenance jurisdictions, is appropriate. Naturally, this impedes the ability of the agency or entity to identify and implement practices and policies which improve winter maintenance effectiveness and efficiency.

The traditional approach to addressing this problem is to develop a winter severity index, which is an attempt to quantify, in a single figure, the impact of varying weather conditions on winter maintenance. There are, however, numerous problems with such an approach to quantification. One problem is that this approach is developed by drawing simplified and often statistical relationships between past weather conditions and historical agency resource utilization. Thus, such indices are typically simply a reflection of an agency's historical response to weather conditions, and thus not a reliable independent metric.

This is reflected in the fact that there are few, if any, instances of an agency successfully adopting and applying a winter severity index developed within another agency. Almost invariably, each agency will change the index, or develop a new index altogether, that better explains the relationship it has historically experienced between weather conditions and maintenance data. This ad-hoc, agency-to-agency approach makes cross-jurisdictional comparisons of maintenance efficiency very difficult. Additionally, the value of winter severity indices is inherently limited because of the gross oversimplification of the underlying relationships. The same weather conditions may elicit an entirely different (yet still appropriate) winter maintenance response depending upon traffic patterns, maintenance policies and resources, and the characteristics of the ambient environment the roads are embedded in. None of these factors can be accounted for by a normalizing metric that is based upon weather alone.

BRIEF SUMMARY OF THE INVENTION

Agencies and entities responsible for winter transportation infrastructure maintenance are often confronted with the enormously difficult problem of measuring the effectiveness and efficiency of their snow and ice control operations. The quantity of resources utilized, and the effectiveness of these winter maintenance activities, are both difficult to measure and difficult to normalize for weather conditions that vary over both time and space. The present invention provides winter maintenance managers with a combination of tools to address these problems with traditional methods and systems of measurement.

The present invention is a system and method of managing performance and outcome of winter transportation infrastructure maintenance activities that is comprised of two components: one in the form of a tool for quantifying the maintenance activities that are performed (and the results of those activities), and a second for independently simulating maintenance activities which were required (and the expected results of those activities) in response to observed weather conditions. Together, these two components provide a comprehensive solution that both enables winter maintenance managers to better understand their current winter maintenance operations, and provides independent, weather-sensitive metrics against which the effectiveness and efficiency of winter maintenance operations can be evaluated.

The quantification component of the present invention includes several features which materially improve the ability to evaluate performance of winter transportation infrastructure maintenance systems. The quantification component integrates a vendor-independent database of information collected by snow maintenance vehicles with hardware and modules configured to carry out various data processing functions. Among these are functions for determining a direction of maintenance vehicle travel in the context of a road network, and using lane information to further assist registration of data to an agency's road network. Other data processing functions accommodate a generic system of road network segmentation for geo-registration of maintenance data based on location, direction of travel, and/or lane information, and provide the ability to simultaneously track and register separate activities a maintenance vehicle may be instantaneously performing to separate lanes (including opposing lanes) of a stretch of highway.

The quantification component also includes the ability to break down reported material mixtures, or applications, into their component materials, to facilitate comparisons across maintenance divisions that may use differing mixtures, and the ability to track key quantities of interest to maintenance managers that are not readily identifiable from the GPS- and time-tagged truck reports. An example of this is the total distance driven with a particular plow in the down position so as to permit analysis of factors influencing the rate of blade wear. The quantification component also includes the ability to aggregate GPS- and time-tagged truck reports into 'maintenance actions' that are more easily assessed for appropriateness for conditions, or consistency with agency-provided maintenance guidelines, and leverages an approach for preventing erroneous accrual of such data owing to GPS stray while a truck is physically stationary. An example of this is to set lower limits on speeds and distances traveled at which a vehicle is assumed to be performing maintenance. This is particularly beneficial in a situation where trucks are left stationary all day, yet may be showing low calculated speeds or distances because of GPS stray. If such a vehicle is unloading material at the same time, or has a plow in a down position, this may inadvertently accumulate into substantial quantities over time.

The quantification component further includes modules for viewing and analyzing the collected data with a graphical user interface. These modules permit specification of user-selectable timeframes for analysis, ranging from hour-by-hour up to seasonal applications of the data, tabular presentations organized such that each row represents data for a single truck/road segment combination, that can be grouped by truck, road segment, routes (groups of road segments), and/or all in order to analyze data in whichever way best accommodates the particular application of the data, map-based presentations of the data as registered to the agency's road network, and filters for defining more complex groupings of trucks and/or road segments, and limiting data assessments to those groups. Further capabilities include exporting raw and/or grouped data for external analysis and application.

The simulation component of the present invention also has several features which materially improve the ability to evaluate performance of winter transportation infrastructure maintenance systems. The simulation component incorporates a road condition assessment, along with observed or otherwise assessed weather information, agency-provided information such as traffic profiles, road construction, etc., and environmental parameters to simulate the most likely response in the condition of a road to weather conditions that are experienced. Simulation within the present invention uses one of two approaches for identifying an appropriate maintenance response for each situation requiring maintenance: a response based on agency standard practices, and a dynamically-determined response based on available maintenance resources and agency maintenance policies/practices.

The present invention simulates the impacts of those maintenance actions, and the subsequent need for additional maintenance activities, and makes both the input and simulated data available to a graphical user interface via a series of modules that permit specification of user-selectable timeframes for analysis, ranging from hour-by-hour up to seasonal applications of the data, and tabular, graphical and map-based presentations of both the raw data and its aggregate characteristics. The GUI also includes additional tools such as a calculator function that permits on-the-fly calculation and visualization of multivariate equations reliant upon this data, including, but not limited to, calculations which permit the assignment of costs to individual aspects of the simulated maintenance data to arrive at an overall cost of maintenance, and the calculation of more traditional winter severity indices based upon combinations of the input weather data. Also provided are capabilities for exporting raw and/or aggregated data for external analysis and application.

Other embodiments, features and advantages of the present invention will become apparent from the following description of the embodiments, taken together with the accompanying drawings, which illustrate, by way of example, the principles of the invention.

BRIEF DESCRIPTION OF THE SEVERAL VIEWS OF THE DRAWINGS

The accompanying drawings, which are incorporated in and constitute a part of this specification, illustrate several embodiments of the invention and together with the description, serve to explain the principles of the invention.

FIG. 6 is a tabular view of simulated maintenance activities required on a segment of road within an agency's road network in the simulation component of the present invention;

DETAILED DESCRIPTION OF THE INVENTION

In the following description of the present invention reference is made to the accompanying figures which form a part thereof, and in which is shown, by way of illustration, exemplary embodiments illustrating the principles of the present invention and how it is practiced. Other embodiments will be utilized to practice the present invention and structural and functional changes will be made thereto without departing from the scope of the present invention.

Many agencies and entities responsible for winter transportation infrastructure maintenance collect data from weather maintenance vehicles, often using mobile/maintenance data collection and automated vehicle location systems, known in the industry together as MDC/AVL systems. These utilize global positioning systems (GPS) and on-board data logging and/or transmission capabilities to provide instantaneous GPS-tagged reports of winter maintenance vehicle activities (e.g., plow position(s), material applications, etc.) and/or observed environmental conditions (e.g., road temperatures and/or conditions, etc.). As discussed above, the available data can often vary considerably from one MDC/AVL system to the next, and because of these types of data disparities, the aggregation, road network assignment, and visualization capabilities typically fail to meet an agency's needs to realize the full benefit of that data.

The present invention addresses issues such as those above experienced with existing approaches and technology with a winter transportation infrastructure maintenance method and system that includes two inter-operational components. A first component of the present invention is a quantification component 100 that integrates a plurality of vendor-independent databases 130, one or more servers 170, and multiple management-oriented data processing functions resident in one or more modules to enable agencies to realize the full benefit of their collected winter maintenance data. A second, simulation component 200 is discussed further herein.

Figure 1:
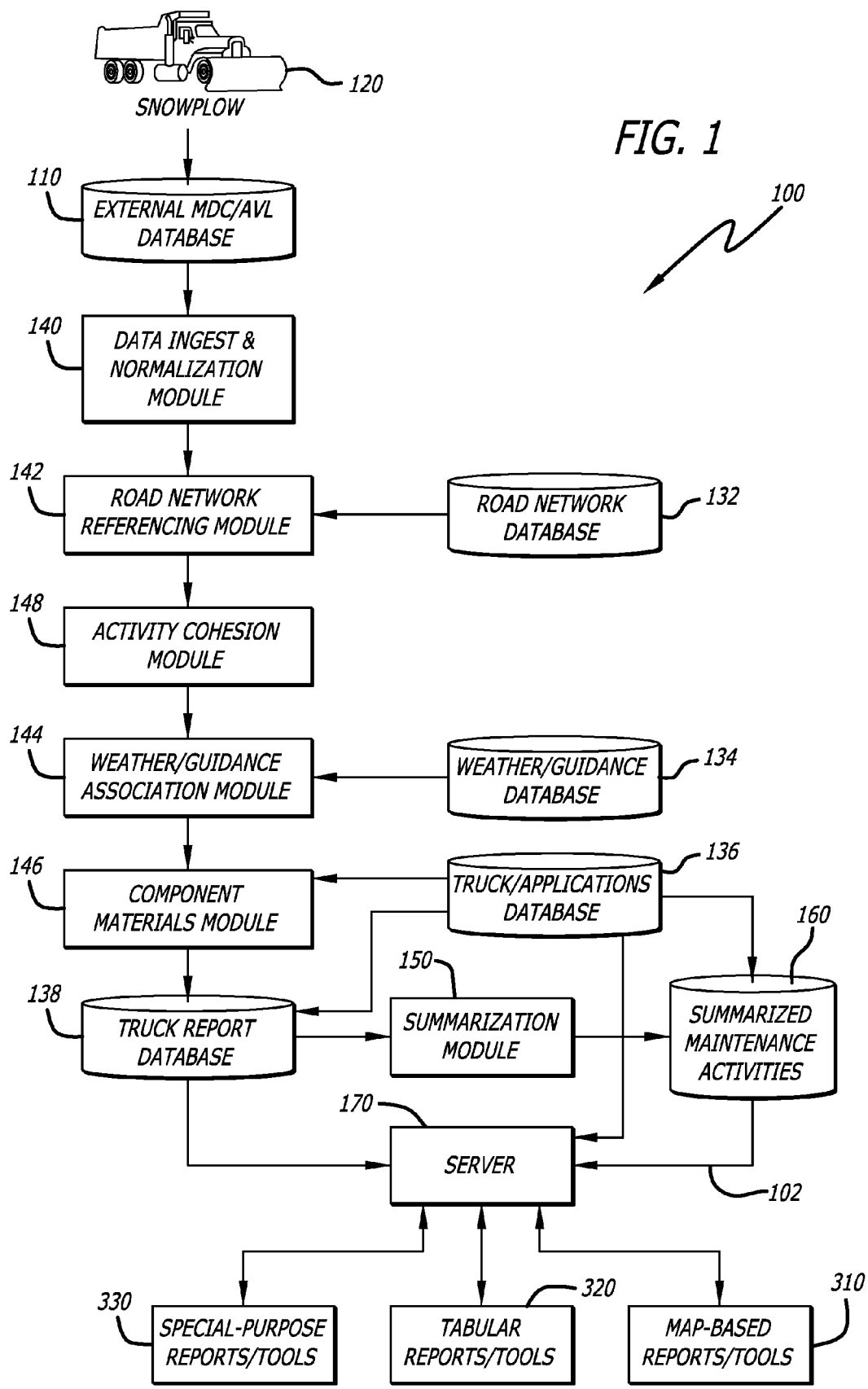
FIG. 1 is a block diagram of a quantification component of the present invention.

FIG. 1 is a block diagram representation of the quantification component 100. The quantification component 100 ingests various types of input data from different sources and maintained by a plurality of databases 130. One such source is mobile data collection and automated vehicle location systems 110, which are coupled to winter maintenance vehicles 120, such as for example snowplows and deicers. The plurality of databases 130 may include a road network database 132, a weather and maintenance activity guidance database 134, trucks and applications databases 136, and a truck reports database 138. Other sources of data acting as input to the quantification component 100 may also be included in the present invention. The input data therefore represents collected winter transportation infrastructure maintenance information that at least includes treatment data, road and transportation network data, weather data, and component apportionment data.

Data from the mobile data collection and automated vehicle location systems 110 is communicated to a data ingest and normalization module 140. This data ingest and normalization module 140 is composed of a plurality of data processing sub-modules, and data from the plurality of databases 130 is communicated to at least one of such data processing sub-modules. For example, data from the road network database 132 may be communicated to a road network referencing module 142, data from the weather and guidance database 134 may be communicated to a weather and guidance association module 144, and data may also be communicated from the trucks and applications database 136 to a component materials module 146. Other sub-modules involved in performing data processing functions in the data ingest and normalization module 140 at least include an activity cohesion module 148, which coalesces a series of GPS-tagged truck reports based on time and location(s) being treated. Each sub-module is configured, as described further herein, to perform one or more data processing functions to arrive at quantified output data 102 for use in determining evaluating effectiveness and efficiency of winter transportation infrastructure maintenance operations.

Output data from the ingest and normalization module 140, together with relevant information about treatment vehicles and treatment applications from the database 136, are aggregated with treatment vehicle reports stored in the truck report database 138 in an aggregation module 150 that generates output data to a quantified maintenance activities database 160. The present invention also includes one or more servers 170, configured to manage a plurality of processors to perform the various data processing functions of the quantification component 100. Together, all of these databases and data processing modules in the data ingest and normalization module 140 provide a comprehensive framework for compiling, maintaining, processing and normalizing data within the quantification component 100.

The quantification component 100 therefore aggregates road, weather, treatment vehicle, and treatment application information collected from a plurality of sources. According to one aspect of the present invention, one way of processing this input data in the quantification component 100 is a comprehensive mechanism for associating GPS-tagged and time-tagged "truck reports" to an agency's transportation infrastructure network, based on data such as GPS position, direction of travel, and lane information. Direction of travel is based upon successive locations relative to a coordinate system, so that the system functions properly in situations with switchbacks, crossovers, underpasses, or other attributes which may not be easily amenable to application of heading-based assignment of a direction of travel (especially in the presence of longer intervals between GPS-tagged reports). Other data, such as for example lane information, is treated in a generic manner amenable to different agencies' lane identification systems, and permits assignment of differing activities being undertaken by the vehicle, at the same instant, to differing lanes (e.g., the vehicle may be treating lanes A and B, but plowing only lane A, where lane B could optionally be in an opposing direction of travel), and thus to potentially differing segments of the agency's transportation infrastructure network.

The quantification component 100 therefore allows for assigning information not only based upon location, but also based upon lane and direction of travel. An associated mechanism for segmenting an agency's transportation infrastructure network in one or more ways is also supported, along with processes for aggregating information based on these defined segments. The quantification component 100 thus permits data assignment and aggregation, e.g. for a particular snowplow route, so that maintenance activities are not only measurable per vehicle, but also per snowplow route, or any number of other defined segmentations of the transportation infrastructure network of interest to the agency.

According to another aspect of the present invention, an additional method of data processing to normalize input data in the quantification component 100 addresses the issue of understanding the component breakdown of material treatment applications being applied to the road network. Snowplows may be equipped to spread arbitrary mixtures of deicer and/or abrasive, in one or more forms (e.g. liquid, dry, pre-wet). For a variety of reasons, the maintenance materials and specific mixtures that are used may vary substantially from one maintenance route to the next. The quantification component 100 of the present invention permits agencies to specify the component materials and apportionments in any particular mixture their fleet may choose to apply and report, so that data from routes or trucks from all across the agency can be compared upon utilization of the component materials that make up the mixtures being applied. This is a significant and valuable feature for agencies, as they may have many different mixtures (e.g. "10% Salt/90% Sand", "15% Salt /85% Sand", "15% Salt/80% Sand/5% Ice Slicer", etc.) in use across a given agency, but a much more limited number of component materials that serve as the fundamental building blocks for these mixtures. The present invention thus permits managers to filter through the variability in material applications and address the more important question of where, when and to what extent the particular component materials they purchase are being utilized.

Other issues managers are faced with when evaluating the winter maintenance operations of their agency are whether a maintenance response was appropriate for the weather conditions, and whether or not recommended maintenance activities are being followed, regardless of whether they are developed from the agency's published set of standard practices or provided by a maintenance support system. The quantification component 100 addresses both of these issues with logic that performs a cohesion of specific GPS-tagged and time-tagged truck reports into coherent maintenance actions representing the collective activities of their fleet during a single treatment of a particular segment of road (e.g, "Trucks A and B collectively spread an average of 235 lbs/ln-mi of pre-wet sodium chloride on road segment C between time D and time E", as opposed to working with the potentially hundreds or thousands of GPS-tagged and time-tagged truck reports that may constitute that maintenance action). These maintenance actions can then be associated with both weather events and specific maintenance recommendations, the characteristics of which are both also stored in one or more additional database storage locations operably coupled to the quantification component 100. Thus, a manager can evaluate the extent to which a particular truck or road segment has been treated in accordance with the agency's maintenance policies, or recommendations that have been received, and the extent to which the treatments being made are considered appropriate for the weather events being treated (e.g., the manager can easily discern whether a particular deicer is being used outside its intended range of pavement temperatures).

The quantification component 100 and simulation component 200 also include, in one aspect of the present invention, interrelating database tables to process and assess collected data as discussed above. Database interrelationships are utilized in conjunction with the block diagram of components in FIG. 1, in addition to the block diagram of components in FIG. 2, and it is to be understood that the present invention is also comprised of a server, protocols, functions, logic, data objects, program instructions, and related software modules for managing the insertion, extraction, and manipulation of the data among the various database components discussed herein. Program instructions may be resident in one or more memory module components of the data processing modules discussed herein, and called to perform the data processing functions necessary to model, analyze and interpret the input data and output data in each of the quantification component 100 and the simulation component 200.

As it pertains to the quantification component 100, data processing is performed across a plurality of functions in one or more of the modules therein for conducting various operations on the input data, including but not limited to data processing functions for manipulating treatment applications and component materials, data processing functions for managing vehicles, data processing functions for managing GPS and time-tagged truck reports, and data processing functions for managing environmental variables.

Functions for manipulating treatment applications and component materials include a get_materials function, which retrieves data objects associated with available component materials from one or more databases for processing. Similarly, a get_applications function retrieves data objects associated with specific applications from the one or more databases. A create_applications function may create, configure and name one or more new treatment applications comprised of one or more component materials. An update_applications function permits modification of properties of one or more existing applications, and a delete_applications function marks one or more applications as deleted. It should be noted that the application itself is not deleted from the database; the application itself remains accessible for interpretation of items such as previously-received truck reports, which are dependent on them.

Treatment vehicle management functions within the data processing functions of the one or more modules in the quantification component 100 include functions for creating, updating, deleting, and obtaining information related to maintenance vehicles such as trucks. For example, create_trucks is a function for creating and configuring one or more new vehicles in the one or more databases. Update_trucks serves the purpose of updating existing properties associated with one or more vehicles, and get_trucks retrieves one or more data objects associated with vehicles. Delete_trucks marks vehicles as deleted, but does not actually delete them, so that they are still accessible for interpretation of truck reports dependent upon them.

The quantification component 100 also includes specific data processing functions managing GPS-tagged and time-tagged vehicle or truck reports. For example, a get_truck_reports function retrieves data objects associated with vehicle reports from the one or more databases, while get_latest_truck_reports retrieves the identifiers of most recent vehicle reports from specific vehicles. A create_truck_reports function creates new GPS-tagged and/or time-tagged vehicle reports, update_truck_reports updates the properties of one or more vehicle reports, replace_truck_reports replaces all the properties of one or more vehicle reports without deleting associations of the vehicle reports replaced, and delete_truck_reports deletes specific reports from the one or more databases.

Data processing functions for managing environmental variables may also be included. For example, a get_variables function may be accessed to return a dictionary of qualitative and quantitative variables used in the environment section of vehicle reports.

It is to be understood that these functions may be built and incorporated into one or more of the modules with any name and with specific purposes that differ than those explicitly described, depending on the type of data processing to be conducted in the quantification component 100. Regardless, these functions are integrated to carry out tasks associated with modeling the input data to evaluate the effectiveness and efficiency of winter transportation infrastructure maintenance activities in the present invention.

No aspect of the present invention is to be limited by any method of creating or storing "raw" data, and therefore it is contemplated that input and output data may be presented, maintained, manipulated and stored in a number of ways for the above data processing functions. For example, a data object for passing truck reports between the server and external processes may be formatted as JavaScript Object Notation-(JSON) or any other programming paradigm suitable for accomplishing the intentions presented herein.

As discussed above, the quantification component 100 permits an improved understanding of winter maintenance activities performed. The present invention expands upon the metrics generated by the quantification component 100 and the value of the data processing analytics available by providing, in a second component 200, similar data from a corresponding, independently-generated simulation of winter maintenance activities over the same timeframe. The present invention therefore provides managers, engineers, and others responsible for winter maintenance with both the required data in quantified form as well as a measuring stick to enhance performance measurement and evaluation.

Accordingly, the present invention includes a second, simulation component 200 of a winter transportation infrastructure maintenance system. The simulation component 200 allows weather conditions over a potentially lengthy period of time to be defined at, for example, an hourly level, drawing upon a variety of meteorological data resources. The simulation component 200 utilizes a road condition model 220, within which weather information can be transformed into simulated road conditions over time, influenced by the prior road conditions, weather conditions, maintenance actions, traffic, environmental factors, etc. The resulting simulated output data 202 can then be used to estimate the impacts of weather conditions on road users, road administrators, and/or the environment.

Figure 2:
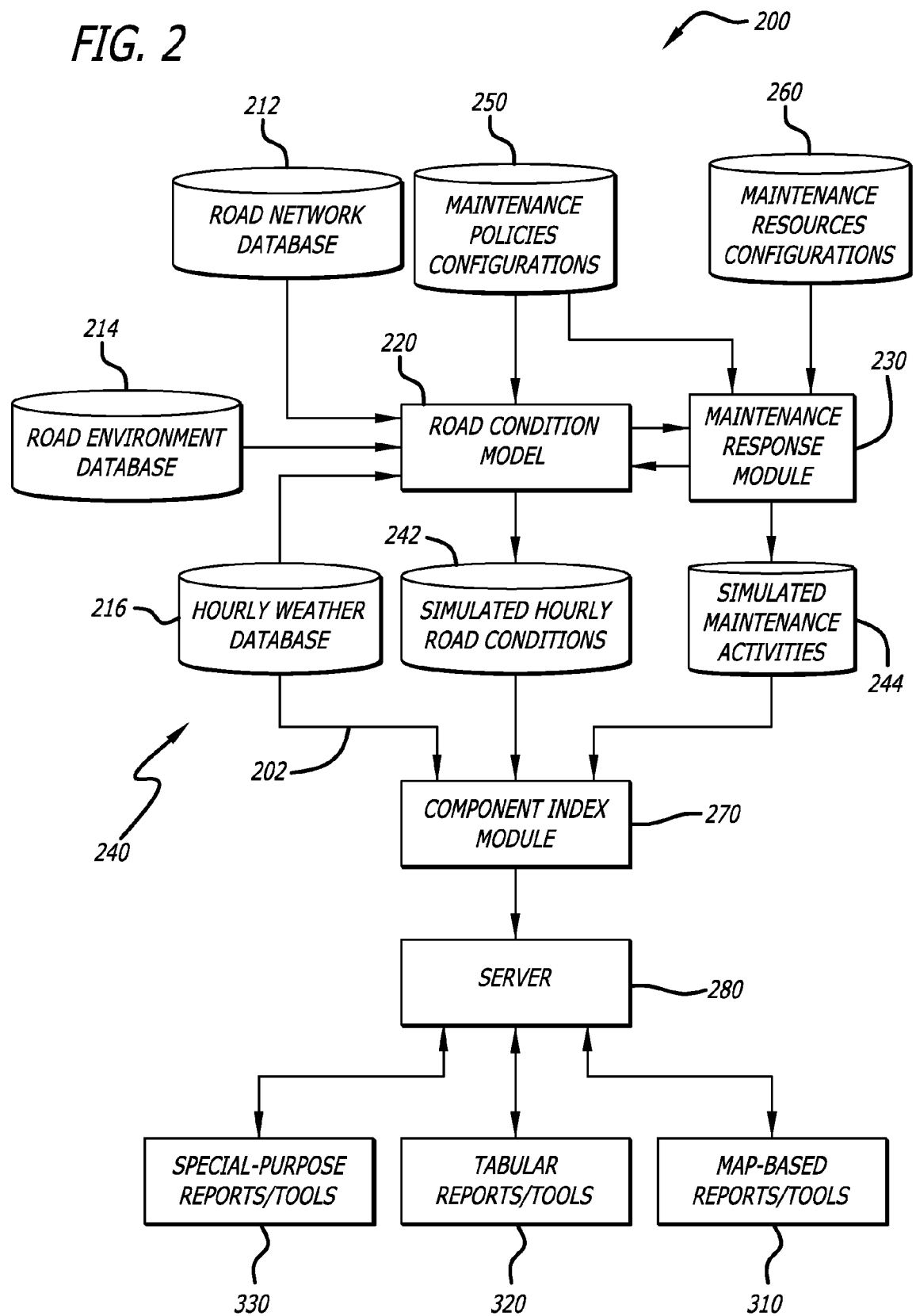
FIG. 2 is a block diagram of a simulation component of the present invention.

FIG. 2 is a block diagram of the simulation component 200 of the present invention. In the simulation component 200, input data comprising observed transportation infrastructure data includes weather data, roadway data, and roadway environmental conditions that at least include traffic profiles, road construction data, prior road conditions, maintenance actions, and environmental conditions. This input data is stored in and accessed from one or more databases 210, including a road network database 212, a road environment database 214, and an hourly weather database 216. The input data is ingested into a road condition model 220 which, together with a maintenance response module 230, performs modeling of road conditions and maintenance activities to generate output data that simulates appropriate winter maintenance activities to specific weather situations and road conditions. This output data may be stored in one or more additional database locations 240, in a simulated hourly road conditions database 242) and in a simulated maintenance activities database 244.

The road condition model 220 and maintenance response module 230 may ingest additional input data relative to maintenance policies and maintenance resource configurations from a maintenance policy database 250 and a maintenance resource database 260. This additional input data modulates the simulation of the road condition model 220 with maintenance responses to weather conditions experienced in at least a portion of a transportation infrastructure by applying either a rules-based model for a specific weather and road condition situation based on an agency's standard maintenance response, or a dynamically-determined maintenance prescription based on available maintenance resources. Therefore, the simulation component 200 can be configured to either utilize rule-based approaches to determining the appropriate winter maintenance response for each situation, or to create dynamic maintenance prescriptions for the situation based on an agency's winter maintenance policies and the available maintenance resources as defined for the simulation location.

Output data from the modeling of road conditions and maintenance activities stored in the plurality of databases 240 may then be aggregated in a component index module 270 and communicated through one or more servers 280 that are at least configured to enable various data processing functions for manipulating the output data 202 as described below.

The resulting weather, road condition, and maintenance data can then be applied in various data processing functions that explore the relationships between, for example, simulated and real-world costs and conditions. In particular, many of the elements of the simulated maintenance data 202 are directly related to the corresponding quantities reported via the agencies' data collection system(s) and are interpreted, aggregated and visualized in the present invention using a graphical user interface as discussed further herein.

The winter maintenance simulation capability of the simulation component 200 relies upon the basic premise that the behavior of the mixture of water, snow, ice and freeze point depressants (the 'dynamic layer') atop a roadway can be modeled. Simulating its characteristics and evolution requires sophisticated road condition modeling performed by a plurality of data processing functions in one or more modules of the present invention. These processes include modeling pavement behavior, natural effects on precipitation, and external influences on the type of precipitation experienced.

Data processing that accounts for pavement behavior includes heat exchange between air and pavement, emission and absorption of infrared radiation, time-varying pavement reflectance, and internal heat conduction. Data processing functions for modeling natural effects associated with precipitation including processes taking into account evaporation, sublimation, conduction of heat, condensation, frost formation, natural phase changes, absorption, insulation, and freeze point variances, and the present invention further permits coupling of mass and energy balance as a feature of such modeling. Additionally, data processing that accounts for external influences on precipitation and pavement conditions includes processes for modeling the effects of traffic spray, traffic compaction, actions of treatment vehicles, condition-dependent precipitation adherence, water runoff, chemical runoff, chemically-induced phase changes, chemical dilution, chemical removal, and effects of residual chemicals.

It is to be understood that these are not exhaustive lists of further data processing, and therefore other types of phenomena are also contemplated herein. For example, the present invention may include modules and program instructions configured to perform an explicit calculation of liquid, ice, frost, compacted snow and snow depths on the road, allowing for mixed conditions such as slush. The effects of the effects of freeze-point depressing chemicals may also be modeled, and the simulation component 200 also permits highly-configurable pavement and maintenance equipment specifications.

From the perspective of a winter severity or maintenance demand index, one distinction offered by the simulation-based approach in this second, simulation component 200 of the present invention is that it yields an explicit simulation of the winter maintenance activities required to address the weather and road conditions each maintenance route is exposed to, rather than attempting to draw expert-based or statistical relationships between simplified representations of the weather conditions and maintenance activities based on historical actions which may or may not have been appropriate, or required, to meet the desired level of service. While the resulting data can be used as the basis for one or more specific indices intended to normalize specific aspects of winter maintenance resource utilization, the simulated data itself is the unique building block offered by this approach, as it removes the mystery from the relationships between weather, road conditions, and maintenance activities. The relationships between cause and effect become more clearly identifiable, as the (e.g.) hour-by-hour time-series of weather, road condition, and simulated maintenance activity requirements are directly available to support assessment of the actual operations of the agency for the selected time period. Further, the factors which impact how one agency prefers to react to a given weather situation can be explicitly accounted for by the simulation, permitting the tool to be applied across jurisdictional boundaries with confidence. For example, the effects of varying levels of service (road condition policies), traffic patterns, available deicers and their environmental limitations, crew and equipment availability, etc., can all be explicitly configured into and accommodated by the simulation process, providing a realistic basis for comparison of data across jurisdictional boundaries where these factors may differ, or even within different parts of the agencies' road networks where practical considerations necessitate different real-world responses to similar weather conditions.

The present invention contemplates that the quantification component 100 and the simulation component 200 are capable of being used either together or separately. It is to be understood that quantified winter maintenance data 102 may be used to separately generate output data representative of independent maintenance activity metrics against which an outcome of a specific winter transportation maintenance infrastructure activity is comparable. It is further understood that simulated winter maintenance data 202 may be used to generate output data to estimate and identify one or more appropriate maintenance response for each specific weather situation requiring a maintenance action. Together, the quantification component 100 and the simulation 200 provide a comprehensive data processing tool set for managing performance and outcome of winter transportation infrastructure maintenance activities.

The present invention further contemplates, in additional embodiments, that agencies and users are capable of accessing input data and output data via a graphical user interface (GUI) that offers a wide range of capabilities for manipulating quantified output data 102 and simulated output data 202. A graphical user interface module 300 within both the quantification component 100 and the simulation component 200 provides data processing functions that at least permit map-based reporting tools 310, tabular reporting tools 320, and customized, specific-purpose reporting tools 330. Each of these reporting tools functions may be performed by specific sub-modules within the graphical user interface module 300.

For example, the graphical user interface and module 300 permits the selection of a time period of interest, so that winter maintenance activities can be analyzed for a particular shift, weather pattern, day or storm, over an entire season, or from season-to-season, in a single data processing display. Users are also presented with options to view summarized data in either tabular or map-based presentations. The tabular presentation provides, for example, access to information per vehicle and road network segment pairing. The map-based presentation provides, for example, color-coded roads per road network segment, based upon the parameters selected, with pop-up windows providing access to details per vehicle for each segment. Within the quantification component, the parameters selected may include any or all of duration and/or distance the vehicle has driven/plowed/applied material, durations and/or distances for each of up to several plows mounted on a specific truck, and durations, distances, and/or total quantities of material applications, optionally provided by component materials rather than in mixed forms.

In the graphical presentation of the tabular reporting tools 320 of the quantification component, the data may be provided for each truck/segment pairing, one pairing per row, which may be aggregated over any or all of truck, segment, and/or route (a route being a predefined grouping of road network segments), in which case data from grouped rows are aggregated and presented as combined rows in the table. When all of the possible aggregations are selected, a single row containing the aggregate data for the entire group of trucks and road segments is provided, for the time period selected. The columns of the tables provide each of the selected parameters for the trucks and/or segments making up each row of data. The entire table can be sorted numerically, in increasing or decreasing order, on any of the available parameters (e.g., data could be sorted so that the rows containing the largest quantity of a particular component material could be brought to the top). User-definable filters can be created and saved, permitting inclusion or exclusion of certain trucks and/or road segments from the tabular or map data.

Figure 3:
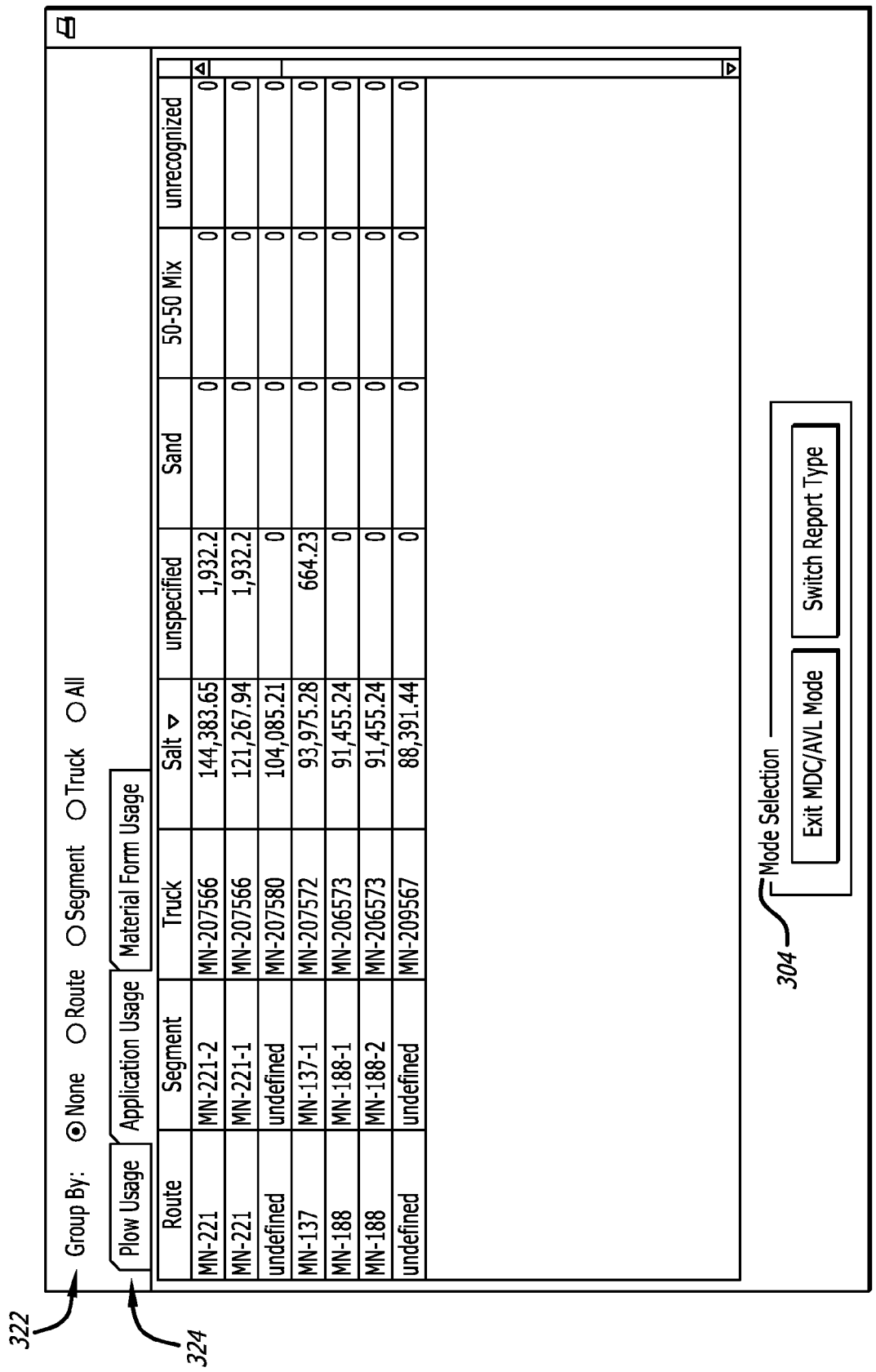
FIG. 3 is a tabular representation of MDC/AVL (Maintenance Data Collection/Automated Vehicle Location) data in the quantification component of the present invention, with associated grouping, filtering and sorting options.
Figure 4:
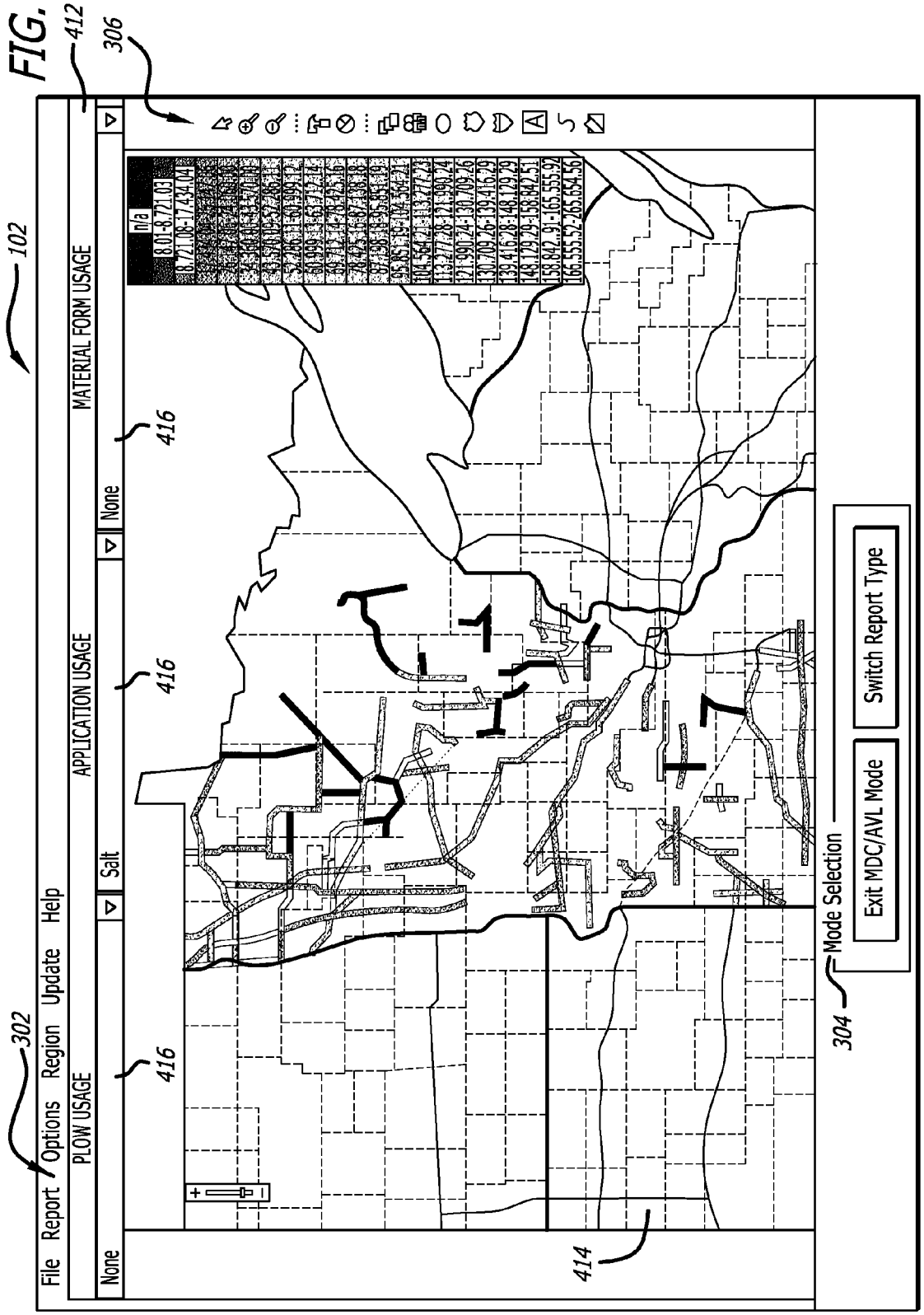
FIG. 4 is an example of a map-based representation of MDC/AVL data in the quantification component of the present invention, after being assigned and aggregated over segments of an agency's road network.

Examples of tabular and map-based presentations of data in a graphical user interface in the quantification component 100 are provided in FIG. 3 and FIG. 4, respectively. Other summarizations of the data are also possible in the present invention, such as comparative data on agency maintenance actions relative to agency standard practice (or externally-generated recommendations), and maintenance actions presented alongside the properties of the road and weather events being treated. Additionally, the quantification component 100 supports the generation of specific reports that are not amenable to the aforementioned tabular, graphical or map-based presentations. These reports are generated by specialized server-side modules that return the reports in HTML or other appropriate formats, for display in the GUI or standard web browsers.

FIG. 3 is an exemplary screenshot showing a tabular representation of quantified output data 102. The tabular representation is generated by the tabular reporting tool 320 of the graphical user interface module 300 for display to a user on the graphical user interface according to one embodiment. FIG. 3 depicts options associated with grouping indicia 322 and usage indicia 324 that are available using the tabular reporting tools 320. With grouping indicia 322, data may be grouped at least by route, segment, or truck, and "All" or "None" options may also be available. Tabbed presentations of data according to usage indicia 324 such "Plow Usage", "Application Usage", and "Material Form Usage" may also be selected to view quantified data 102, and mode selection indicia 304 may also be present for the user to select a mode, such as "Exit MDC/AVL Mode" and "Switch Report Type".

FIG. 4 is an exemplary map-based representation of quantified data 102 generated by the map-based reporting tool 310 of the graphical user interface module 300 for display to a user on the graphical user interface according to another embodiment. The map in FIG. 4 shows quantified data 102 after being assigned and aggregated over segments of an agency's road network. FIG. 4, like FIG. 3, is an exemplary screenshot of the graphical user interface according to the present invention. FIG. 4 includes several pull-down menus 302 for user selection, such as "File", "Report", "Options", etc. Data in the map indicia 414 in the map-based presentation of FIG. 4 may also be depicted by usage indicia 412 according to drop-down selections such as "Plow Usage", "Application Usage" and "Material Form Usage" with additional pull-down menus 416 for specific variables such as materials and applications, and may further include color-coded indicia to identify, within each map-based presentation, specific concentrations or types of materials. FIG. 4 may also present special-purpose legend indicia 306, positioned in the example of FIG. 4 in vertical form along the right-side of the GUI.

The quantification component 100 of the present invention also includes data export capabilities that permit external application of winter maintenance data. One such application is to Maintenance Management Systems (MMS) that focus on higher-level asset management (e.g., time tracking, equipment purchasing/servicing, material procurement and allocation, etc. for winter maintenance) in addition to other applications relative to road construction/maintenance. It is therefore possible to utilize external applications and systems to enhance the understanding of data 102 quantified by the present invention, as well as to leverage external analysis and uses to improve winter transportation infrastructure maintenance.

As with the data processed and reported in the quantification component 100 of the present invention, simulated output data 202 are also available to the user via a graphical user interface. Different data processing selections may be available for simulated data 104. For example, in one embodiment, a user may be permitted to select the time period of interest, whether a particular storm or an entire season. Data are available in several forms, including graphical depictions of the time series of weather and simulated road and maintenance data for a particular segment of road over the selected timeframe, as well as map-based representations and export capabilities for aggregated data.

Figure 5:
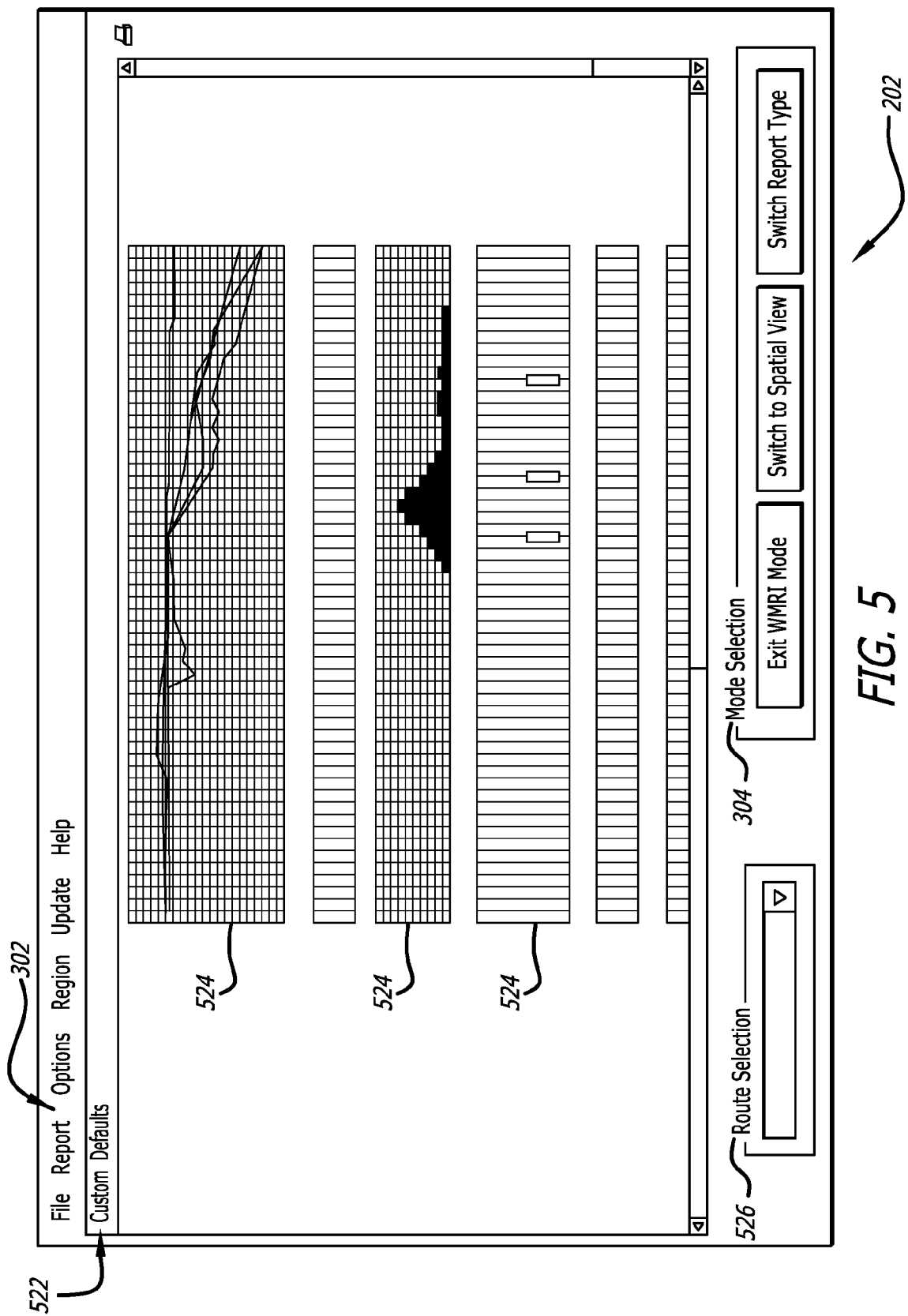
FIG. 5 is a graphical time-series depiction of weather conditions, and simulated road conditions and maintenance activities, for a road segment within an agency's road network in the simulation component of the present invention.

FIG. 5 below is an exemplary screenshot of a graphical time-series display of weather conditions, and simulated road conditions and maintenance activities, for a road segment within an agency's road network. In the example of FIG. 5, pull-down menus 302 are available for selection to the user, such as "File", "Report", "Options", etc. Indicia 304 for Mode Selection may also be present, and may include button-like indicia for "Exit WMRI Mode", "Switch to Spatial View", and "Switch Report Type". Route selection indicia 526 may also be displayed as a box to allow a user to select the location for which a time-series data is displayed. The graphical time-series display, which shows several different graphs as noted above, may be coded with indicia 524 on the horizontal and vertical axes as defined by the user, and may be color-coded. The GUI may include indicia 522 such as "Custom" and "Defaults" permitting the user to customize the presentation of graphical time-series information as needed. It is to be noted that all indicia on the graphical user interface may be shaded or colored in some fashion, and are shown in FIG. 3-9 as gray-scaled or having a gradient for illustration purposes.

Data are also available on the graphical user interface as tabular displays of simulated maintenance data 104 according to the tabular reporting tool 320. FIG. 6 is an exemplary screenshot of a tabular view on the graphical user interface of simulated maintenance activities required on a segment of road within an agency's road network. The screenshot of FIG. 6, like other screenshots discussed herein, includes common pull-down menus 302 for user selection such as "File", "Report", "Options", etc. Data in this tabular view are presented in columns 622 according to location, time, plow position, application, and material usage. Indicia 304 for Mode Selection may also be present, and may include button-like indicia for "Exit WMRI Mode", "Switch to Spatial View", and "Switch Report Type". Route selection indicia 526 may also be displayed to allow a user to enter specific information.

Figure 7:
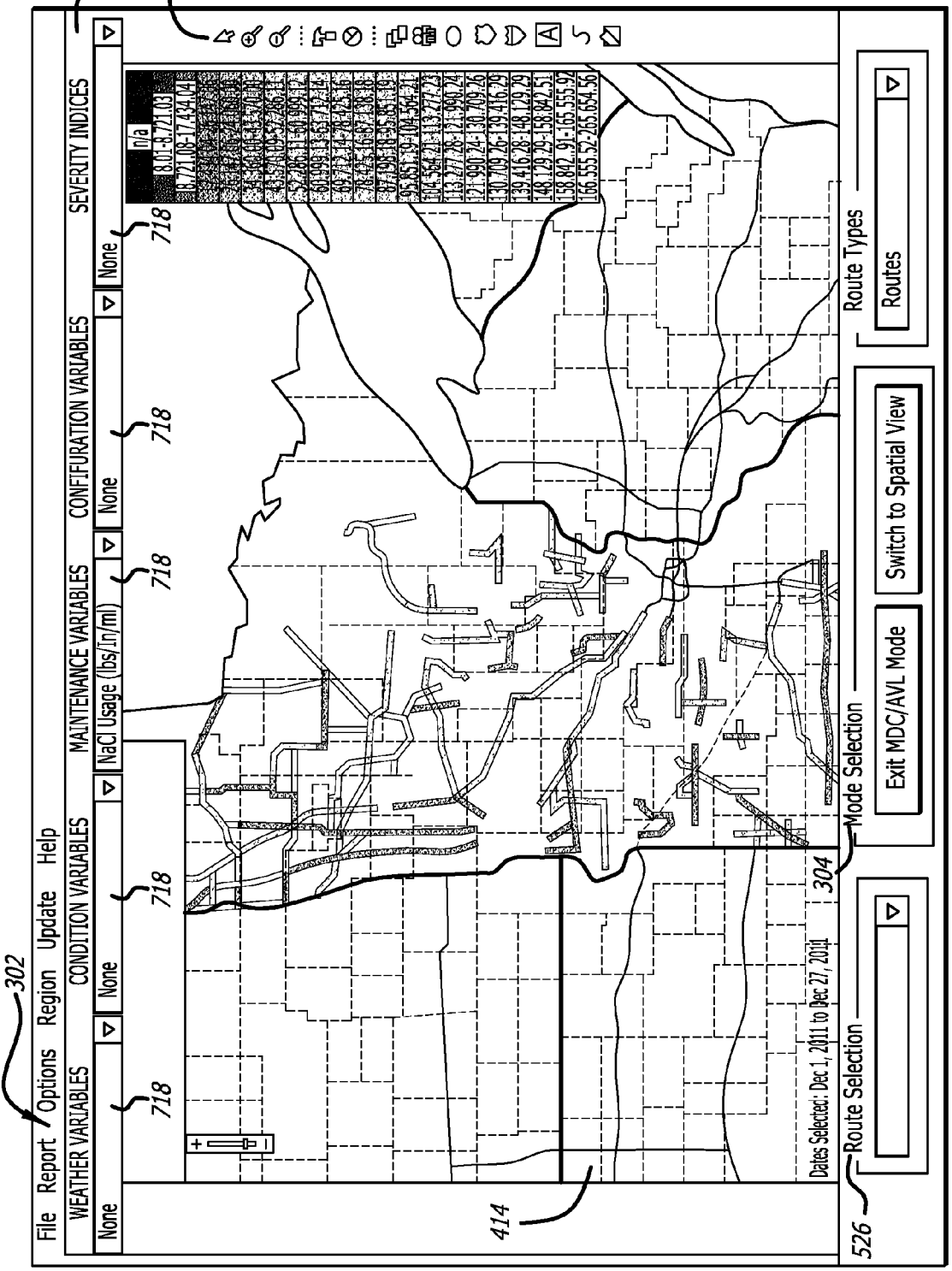
FIG. 7 is a map-based presentation of selected aggregate weather, road condition, or maintenance data as modeled by the simulation component of the present invention, in which the variable displayed is simulated salt usage over the selected period.

Additionally, data are further available on the graphical user interface in the simulation component 200 as map-based presentations of aggregate measures of the weather and/or simulated road condition and maintenance data. FIG. 7 is an exemplary screenshot showing such a map-based presentation of aggregate weather, road condition, or maintenance data as calculated by the simulation system and its input data. In FIG. 7, the variable displayed is simulated salt usage over the selected period. Other Maintenance Variables may also be selected from pull-down menus 718, and additional pull-down menus 718, such as Weather Variables, Condition Variables, Configuration Variables, and Severity Indices may be available to the user to further allow for specific, customized views. Pull down menus 302, route selection indicia 526, mode selection indicia 304, and route types indicia 720 may also be included. Additionally special purpose indicia 306 may be displayed, which are shown in vertical form in the example of FIG. 7.

Figure 8:
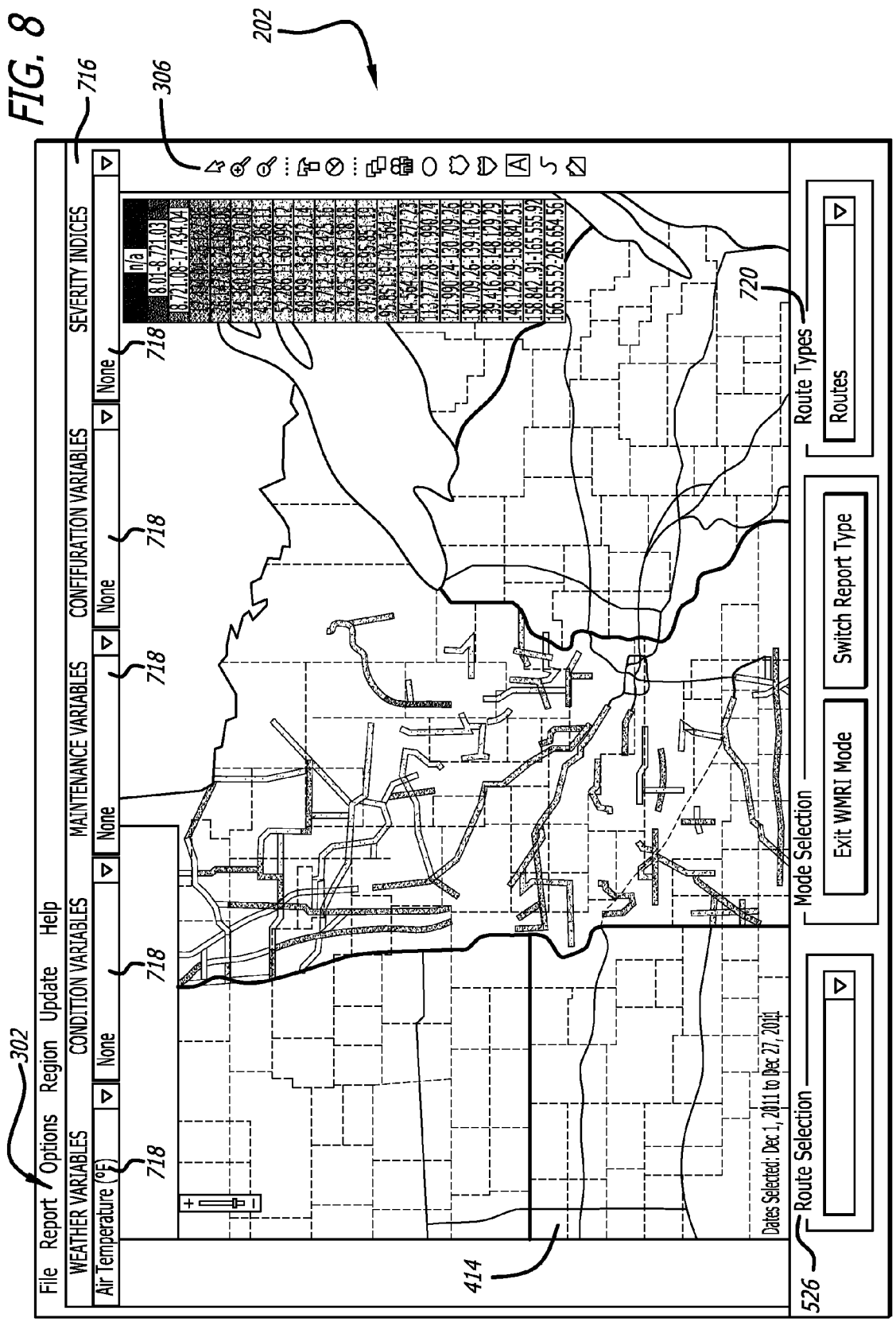
FIG. 8 is a map-based presentation of selected aggregate weather, road condition, or maintenance data as modeled by the simulation component of the present invention, in which the variable displayed is the average air temperature over the selected period.

FIG. 8 is also a map-based presentation of selected aggregate weather, road condition, or maintenance data as modeled by the simulation component 200. FIG. 8 shows a different view in which a weather variable is displayed, rather than a maintenance variable as in FIG. 7. The weather variable displayed is the average air temperature over the selected period. Indicia as indicated for FIG. 7 may also be displayed.

The graphical user interface module 300 also includes data export capabilities for simulated data 104 to permit external application thereof. Similar to the quantification component 100, data export capabilities in the simulation component 200 permit external application of winter maintenance data, such as with respect to Maintenance Management Systems (MMS) that focus on higher-level asset management (e.g., time tracking, equipment purchasing/servicing, material procurement and allocation, etc. for winter maintenance) in addition to other applications relative to road construction/maintenance.

Figure 9:
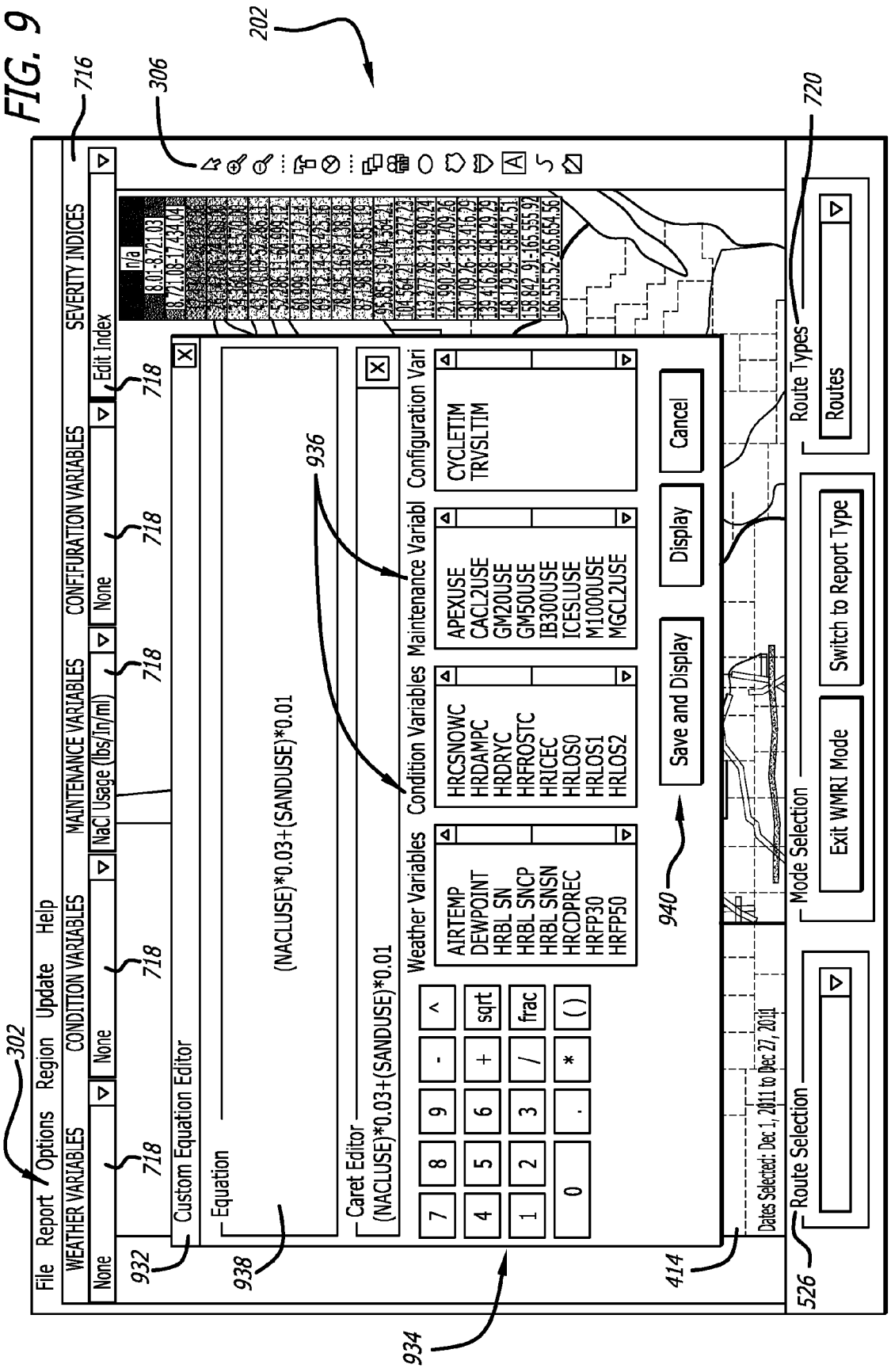
FIG. 9 is a calculator tool associated with the map-based presentation tool for the simulation component of the present invention, permitting multivariate calculations based upon available weather, road condition, and/or maintenance parameters.

Many other data processing functions are also contemplated within the present invention and accessible using the graphical user interface. For example, the Severity Indices menu 718 provides users access to an equation editor 932 to perform and display complex multivariate calculations based on the available data elements. FIG. 9 shows a screenshot similar to that of FIG. 7 and FIG. 8, with a calculator tool 934 shown for using the equation editor 932.

The equation editor 932 is associated with the map-based reporting tool 310 for the simulation component 200, permitting multivariate calculations based upon available weather, road condition, and/or maintenance parameters. Numerical indicia appears as it would on a calculator, and weather, condition, maintenance, and configuration variables may be selected from additional pull-down menus 936. Separate indicia 938 for entering and displaying equations is also available, and the user may further select to save, display, and cancel the creation of a multivariate equation entered into the equation editor using indicia 940.

Many calculations are permitted in the equation editor 932. For example, a user may multiply the per-mile simulated quantity of a deicer by its associated unit cost, and then add the per-mile cost of operating the truck multiplied by the simulated number of maintenance actions, to arrive at an overall, simulated cost of winter maintenance per-mile for the selected time period. Alternatively, if a user desired to compare and contrast the simulated data with more traditional measures of winter severity, the calculator tool 932 can be used to specify the equation for the particular winter severity measure, at which point the simulation component 200 applies the underlying weather data to calculate and display the desired winter severity measure.

It is important to note that while the quantification component 100 and the simulation component 200 of the present invention offer significant value when applied in tandem, neither component requires the other in order for the present invention to operate and provide value to winter maintenance managers. Accordingly, the present invention contemplates that two components may be utilized either alone or in combination, as desired by the user, as noted in detail herein.

It is to be understood that other embodiments will be utilized and structural and functional changes will be made without departing from the scope of the present invention. The foregoing descriptions of embodiments of the present invention have been presented for the purposes of illustration and description. It is not intended to be exhaustive or to limit the invention to the precise forms disclosed. Accordingly, many modifications and variations are possible in light of the above teachings. It is therefore intended that the scope of the invention be limited not by this detailed description.

The invention claimed is:

1. A method of evaluating and identifying appropriate maintenance responses in a winter transportation infrastructure, comprising:
    ingesting input data from a plurality of external databases, the input data including 1) collected winter transportation infrastructure maintenance data, the collected winter transportation infrastructure maintenance data including a plurality of treatment data, road network data, weather data, and component apportionment data and 2) observed transportation infrastructure data, including weather data, environmental data, roadway characteristics data, maintenance resources data, and maintenance policies data to a plurality of modules configured to perform multiple data processing functions to 1) model a performance of the winter transportation infrastructure maintenance activities and 2) model roadway conditions with maintenance responses to weather conditions experienced in at least a portion of a transportation infrastructure;
    quantifying the collected winter transportation infrastructure maintenance data by applying the multiple data processing functions to associate one or more of maintenance actions, road network information, weather events, and specific maintenance component applications by
        receiving GPS data and lane position data from treatment data comprised of raw GPS-tagged vehicle reports and data reported directly by maintenance vehicle operators to extract a heading and speed of a reporting maintenance vehicle, define a coordinate system along the transportation infrastructure using successive positions of maintenance vehicles along this coordinate system, and define directions of travel of maintenance vehicles to assign the collected winter transportation infrastructure maintenance data to the transportation infrastructure, and to segment the transportation infrastructure using the location, direction of travel, and lane position data to associate and calculate values for plurality of segments that are pre-defined by agency specification,
            wherein the GPS data and the lane position data enable an aggregation and interpretation of the raw GPS-tagged vehicle reports and of time-tagged vehicle reports in the treatment data into comprehensive, spatially, and temporally-cohesive representations of collective fleet maintenance activities during one or more treatment activities on pre-defined segments of the transportation infrastructure that are comparable to simulated maintenance responses and agency treatment guidelines,
            and wherein the GPS data and the lane position data permit detection and prevention of erroneous accrual of data either due to GPS stray while an associated vehicle is stationary or due to road network complexities such as intersecting or vertically stacked network segments,
        and
        specifying component materials and apportionments of component materials in at least one selectable mixture comprising the component apportionment data to compare utilization of the component materials and mixtures being applied to the transportation infrastructure; and
    applying a road condition model to generate a simulation of road conditions responsive to maintenance activities and weather conditions experienced in at least a portion of a transportation infrastructure by integrating the weather data, environmental data, roadway characteristics data, and one or more behavioral characteristics of specific treatments applied to the transportation infrastructure in the multiple data processing functions;
    modulating the road condition model generating the simulation of road conditions responsive to maintenance activities and weather conditions experienced in at least a portion of a transportation infrastructure by applying a maintenance prescription model representative of an agency's standard maintenance treatment in at least one of a rules-based model for a specific weather and treatment situation and a dynamically-determined response based on available maintenance resources to generate a simulated impact of candidate maintenance treatments, the applying and modulating of the road condition model generating simulated road condition and maintenance data; and
    generating output metrics against which 1) an outcome of a specific winter transportation maintenance infrastructure activity is comparable to evaluate an effectiveness and an efficiency of winter maintenance activities and 2) an outcome of specific maintenance responses are evaluated to enable identification of one or more appropriate maintenance response for each situation requiring maintenance.

2. The method of claim 1, further comprising presenting quantified maintenance data and simulated road condition and maintenance data in a graphical user interface.

3. The method of claim 2, further comprising presenting, on the graphical user interface, selectable characteristics in a plurality of pull-down menus and enabling a plurality of views of the quantified maintenance data and the simulated road condition and maintenance data, the plurality of views at least including a tabular format and a map-based format.

4. The method of claim 1, further comprising communicating with the plurality of external databases to request the input data from the plurality of external databases as needed.

5. The method of claim 4, wherein the communicating with the plurality of external databases further comprises communicating with at least one mobile data collection and automated vehicle location system coupled to at least one maintenance vehicle.

6. The method of claim 1, further comprising executing on or more program instructions resident in at least one memory module and configured to be accessed to perform the multiple data processing functions.

7. The method of claim 1, wherein the applying the maintenance prescription model representative of an agency's standard maintenance treatment in at least one of a rules-based model for a specific weather and treatment situation and a dynamically-determined response based on available maintenance resources to generate a simulated impact of candidate maintenance treatments further comprises modulating the simulation with data representative of traffic patterns and road construction characteristics appropriate for the corresponding locations within the infrastructure.

8. The method of claim 1, wherein the modulating the road condition model generating the simulation of road conditions responsive to maintenance activities and weather conditions experienced in at least a portion of a transportation infrastructure by applying a maintenance prescription model representative of an agency's standard maintenance treatment further comprises selecting maintenance treatments appropriate for adherence to road condition policies of one or more responsible agencies to account for varying levels of service using available component materials, personnel, and equipment.

9. A method of managing performance and outcome of winter transportation infrastructure maintenance activities, comprising:
modeling a performance of the winter transportation infrastructure maintenance activities by processing input data in a first plurality of data normalization functions to associate winter transportation maintenance actions with weather events and treatment recommendations, the first plurality of data normalization functions including
receiving GPS data and lane position data from treatment data comprised of raw GPS-tagged vehicle reports and data reported directly by maintenance vehicle operators to extract a heading and speed of a reporting maintenance vehicle, define a coordinate system along a transportation infrastructure using successive positions of maintenance vehicles along this coordinate system, and define directions of travel of maintenance vehicles to assign the collected winter transportation infrastructure maintenance data to the transportation infrastructure, and to segment the transportation infrastructure using the location, direction of travel, and lane position data to associate and calculate values for plurality of segments that are pre-defined by agency specification,
wherein the GPS data and the lane position data enable an aggregation and interpretation of the raw GPS-tagged vehicle reports and of time-tagged vehicle reports in the treatment data into comprehensive, spatially, and temporally-cohesive representations of collective fleet maintenance activities during one or more treatment activities on pre-defined segments of the transportation infrastructure that are comparable to simulated maintenance responses and agency treatment guidelines,
and wherein the GPS data and the lane position data permit detection and prevention of erroneous accrual of data either due to GPS stray while an associated vehicle is stationary or due to road network complexities such as intersecting or vertically stacked network segments,
and
specifying component materials and apportionments of component materials in at least one selectable mixture comprising the component apportionment data to compare utilization of the component materials and mixtures being applied to the transportation infrastructure;
modeling roadway conditions and maintenance responses to weather conditions experienced in at least a portion of a transportation infrastructure by processing the input data in a second plurality of data normalization functions configured to associate the weather condition data to transportation network data, relate a road condition model with one or more behavioral characteristics of specific treatments applied to the transportation network, and apply at least one of a rules-based model for a specific weather and treatment situation and a dynamically-determined response based on available maintenance resources to generate a simulated impact of candidate maintenance treatments;
generating a plurality of output data capable of manipulation to quantify and simulate winter transportation maintenance infrastructure activities to evaluate and identify one or more appropriate maintenance response for as specific situation requiring maintenance; and
presenting the output data to a user in one or more sets of indicia on a graphical user interface, the graphical user interface enabling the user to perform a plurality of customizable applications to the output data further comprising presenting the user with selectable characteristics in a plurality of pull-down menus on the graphical user interface, and enabling a plurality of views of the output data, the plurality of views at least including a tabular format and a map-based format.

10. The method of claim 9, further comprising ingesting the input data into a plurality of modules configured to model the performance of the winter transportation infrastructure maintenance activities and to model roadway conditions and maintenance responses to weather conditions experienced in at least a portion of a transportation infrastructure ,the input data including 1) collected winter transportation infrastructure maintenance data, the collected winter transportation infrastructure maintenance data including a plurality of road treatment data, transportation network data, weather data, and component apportionment data and 2) observed transportation infrastructure data, including weather data, environmental data, and roadway characteristics data.

11. The method of claim 10, further comprising receiving additional input data from a maintenance policies database and a maintenance resources database to apply at least one of a rules-based model for a specific weather and treatment situation and a dynamically-determined response based on available maintenance resources to generate a simulated impact of candidate maintenance treatments.

12. The method of claim 11, further comprising communicating with a plurality of external databases to request the input data and the additional input data from the plurality of external databases as needed.

13. The method of claim 12, wherein the communicating with the plurality of external databases further comprises communicating with at least one mobile data collection and automated vehicle location system coupled to at least one maintenance vehicle to receive at least a portion of the input data.

14. The method of claim 9, wherein the relating the road condition model with one or more behavioral characteristics of specific treatments applied to the transportation network in the second plurality of data normalization functions further comprises modeling a plurality of processes associated with pavement behavior, the plurality of processes including at least one of heat exchange between air and pavement, emission, reflectance and absorption of solar and infrared radiation, time-varying pavement reflectance, and internal heat conduction.

15. The method of claim 9, wherein the relating the road condition model with one or more behavioral characteristics of specific treatments applied to the transportation infrastructure in the second plurality of data normalization functions further comprises modeling a plurality of processes associated with precipitation, the plurality of processes at least including evaporation, sublimation, condensation, frost formation, conduction of heat, natural phase changes, and insulation.

16. The method of claim 9, wherein the relating the road condition model with one or more behavioral characteristics of specific treatments applied to the transportation network in the second plurality of data normalization functions further comprise modeling a plurality of processes associated with external influences, the plurality of processes at least including effects of traffic spray, traffic compaction, effects of treatment vehicles, condition-dependent precipitation adherence, water runoff, chemical runoff, chemically-induced phase changes, chemical dilution, chemical removal, and effects of residual chemicals.

17. A winter transportation infrastructure maintenance evaluation tool, comprising:
  a quantification module integrating collected winter transportation infrastructure maintenance data from a plurality of external databases and comprising one or more program instructions configured to execute a plurality of data processing functions on the collected winter transportation infrastructure maintenance data, the plurality of data processing functions normalizing the collected winter transportation infrastructure maintenance data by associating maintenance actions, road network information, weather events, and specific maintenance component applications by
    receiving GPS data and lane position data from treatment data comprised of raw GPS-tagged vehicle reports and data reported directly by maintenance vehicle operators to extract a heading and speed of a reporting maintenance vehicle, define a coordinate system along a transportation infrastructure using successive positions of maintenance vehicles along this coordinate system, and define directions of travel of maintenance vehicles to assign the collected winter transportation infrastructure maintenance data to the transportation infrastructure, and to segment the transportation infrastructure using the location, direction of travel, and lane position data to associate and calculate values for plurality of segments that are pre-defined by agency specification,
    wherein the GPS data and the lane position data enable an aggregation and interpretation of the raw GPS-tagged vehicle reports and of time-tagged vehicle reports in the treatment data into comprehensive, spatially, and temporally-cohesive representations of collective fleet maintenance activities during one or more treatment activities on pre-defined segments of the transportation infrastructure that are comparable to simulated maintenance responses and agency treatment guidelines,
    and wherein the GPS data and the lane position data permit detection and prevention of erroneous accrual of data either due to GPS stray while an associated vehicle is stationary or due to road network complexities such as intersecting or vertically stacked network segments,
    and
    specifying component materials and apportionments of component materials in at least one selectable mixture comprising the component apportionment data to compare utilization of the component materials and mixtures being applied to the transportation infrastructure; and
  a simulation module processing observed transportation infrastructure maintenance data from a plurality of external databases and comprising one or more program instructions configured to execute a plurality of data processing functions on the observed transportation infrastructure maintenance data, the plurality of data processing functions normalizing the observed transportation infrastructure data by performing a road condition model by integrating weather data, environmental data, and roadway characteristics data, and one or more behavioral characteristics of specific treatments applied to the transportation infrastructure in multiple data processing functions, and modulating the simulation of the road condition model with maintenance responses to weather conditions experienced in at least a portion of a transportation infrastructure by applying at least one of a rules-based model for a specific weather and treatment situation and a dynamically-determined response based on available maintenance resources to generate a simulated impact of candidate maintenance treatment; and
  a graphical user interface module aggregating output data from the quantification module and output data from the simulation module for presentation to a user in a graphical user interface tool configured to enable the user to perform a plurality of customizable applications,
  the quantification module and the simulation module generating the output data capable of manipulation to evaluate and identify one or more appropriate maintenance response for specific situations requiring maintenance.

18. The system of claim 17, further comprising at least one processor and at least one memory module in which the one or more program instructions are configured to perform the plurality of data processing functions normalizing the collected winter transportation infrastructure maintenance data and the plurality of data processing functions normalizing the observed transportation infrastructure maintenance data.

19. The system of claim 17, wherein the graphical user interface tool includes a plurality of sets of indicia presenting the user with selectable characteristics for analyzing the output data from the quantification module and output data from the simulation module in a plurality of pull-down menus and viewing the output data from the quantification module and output data from the simulation module in a plurality of views at least including a tabular format and a map-based format.

20. The system of claim 17, wherein the simulation module integrates additional input data from a maintenance policies database and a maintenance resources database among the plurality of external databases to apply the at least one of a rules-based model for a specific weather and treatment situation and a dynamically-determined response based on available maintenance resources to generate a simulated impact of candidate maintenance treatment.

21. The system of claim 17, wherein the plurality of external databases includes at least one mobile data collection and automated vehicle location system coupled to at least one maintenance vehicle to receive at least a portion of the collected winter transportation infrastructure maintenance data.

22. The system of claim 17, wherein the multiple data processing functions integrating the road condition model with one or more behavioral characteristics of specific treatments applied to the transportation infrastructure include a plurality of processes associated with pavement behavior, a plurality of processes associated with precipitation, and a plurality of processes associated with external influences.

* * * * *